(12) United States Patent
Fukuda (10) Patent No.: US 7,095,286 B2
(45) Date of Patent: Aug. 22, 2006

(54) PLL CIRCUIT, COMMUNICATION APPARATUS EQUIPPED WITH PLL CIRCUIT, AND FREQUENCY ADJUSTMENT METHOD

(75) Inventor: Yasushi Fukuda, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 0 days.

(21) Appl. No.: 10/852,092

(22) Filed: May 25, 2004

(65) Prior Publication Data

US 2004/0251974 A1    Dec. 16, 2004

(30) Foreign Application Priority Data

May 26, 2003  (JP)  ............................. 2003-148312

(51) Int. Cl.
*H03L 7/08* (2006.01)

(52) U.S. Cl. ............................. 331/17; 331/44; 327/157

(58) Field of Classification Search ........ 327/156–158, 327/147–148; 331/36 C, 117 R, 11, 16, 331/17, 44
See application file for complete search history.

(56) References Cited

U.S. PATENT DOCUMENTS

| | | | |
|---|---|---|---|
| 5,648,744 A * | 7/1997 | Prakash et al. | ................ 331/11 |
| 6,317,004 B1 * | 11/2001 | Akagi et al. | ................... 331/17 |
| 6,750,750 B1 * | 6/2004 | Jiong et al. | .................. 336/200 |
| 6,803,830 B1 * | 10/2004 | Scheffler | .................... 331/36 C |

FOREIGN PATENT DOCUMENTS

JP        2000-183733        6/2000

\* cited by examiner

*Primary Examiner*—Dinh T. Le
(74) *Attorney, Agent, or Firm*—Arent Fox PLLC

(57) ABSTRACT

A PLL circuit includes a voltage-controlled oscillator having a control voltage terminal, a charge pump, a loop filter having an output coupled with the control voltage terminal via the loop filter, and a part for connecting any point on a route from an output terminal of the charge pump to the control voltage terminal to ground and disconnecting said point from the ground after a frequency of the voltage-controlled oscillator is adjusted.

11 Claims, 8 Drawing Sheets

PLL CIRCUIT, COMMUNICATION APPARATUS EQUIPPED WITH PLL CIRCUIT, AND FREQUENCY ADJUSTMENT METHOD

BACKGROUND OF THE INVENTION

1. Field of the Invention

The present invention relates to a PLL (Phase-Locked Loop) circuit, a communication apparatus equipped with a PLL circuit, and a frequency adjustment method.

2. Description of the Related Art

A PLL synthesizer module used in a communication apparatus has a circuit configuration composed of a VCO (Voltage-Controlled Oscillator), a loop filter circuit, a PLL IC including a charge pump circuit and a phase comparator.

Figure 1:
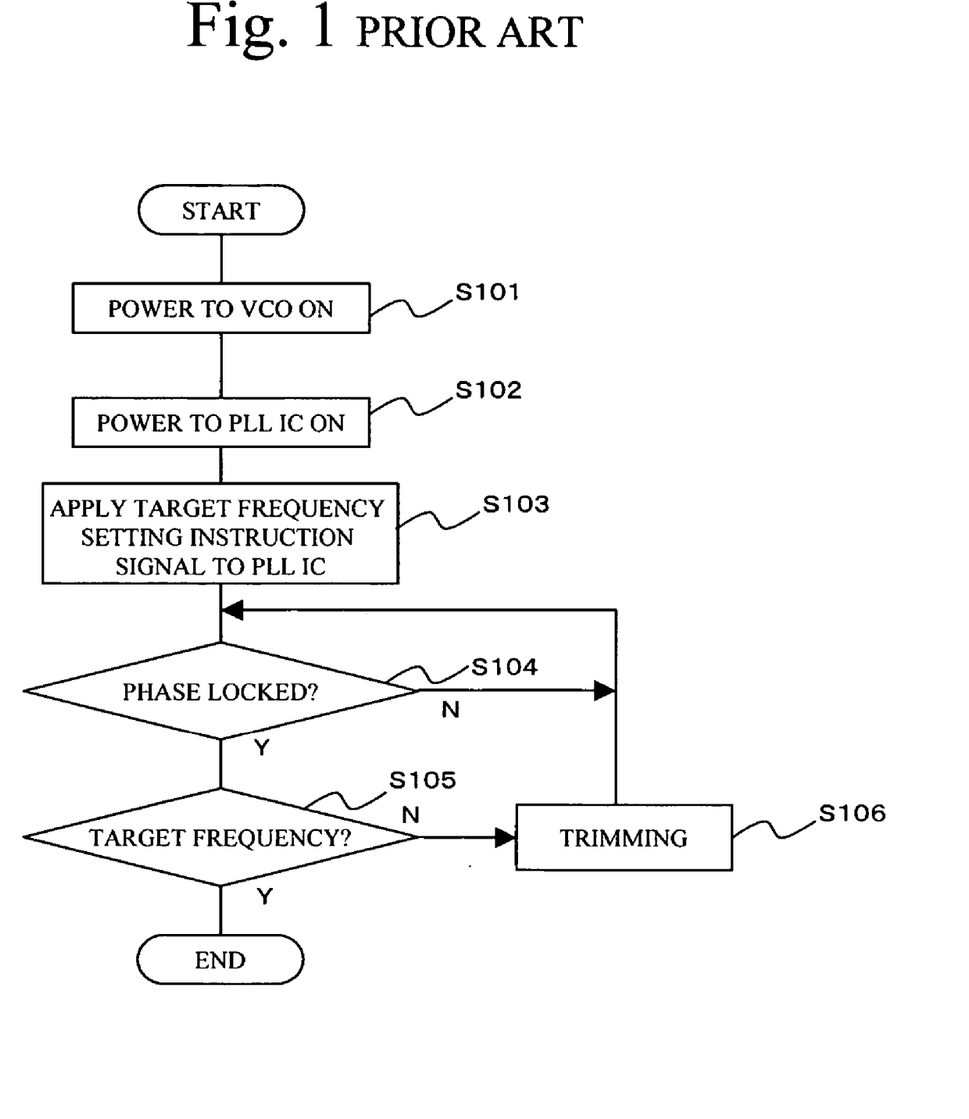
FIG. 1 is a flowchart of a method for adjusting the frequency of a conventional voltage-controlled oscillator.

FIG. 1 is a flowchart of a conventional frequency trimming method for the voltage-controlled oscillator. First, a supply of power to the VCO is started at step S101, and a supply of power to the PLL IC is started at step S102. Next, an instruction signal that indicates a target frequency to be set is written into the PLL IC at step S103. If it is determined, at step S105, whether the VCO deviates from the target frequency at step S105 after the PLL loop is in the locked state (in-phase state) at step S104. If the VCO does not oscillate at the target frequency, the frequency is adjusted by trimming a capacitance element or an inductance element, which elements form the resonance circuit of the VCO. It is to be noted that the frequency adjustment mentioned above is carried out while the PLL IC is working.

However, the conventional trimming-based frequency adjustment needs a long time to set the PLL circuit at the target frequency because the PLL IC is being activated until the target frequency is obtained by applying the control voltage to the frequency control terminal of the VCO through the charge pump circuit. It is therefore difficult to shorten the time it takes to perform the step of trimming. Further, the trimming-based frequency adjustment needs several instruments such as a frequency measurement device, a power supply, and a circuit generating a digital signal used as the input signal to control the PLL IC.

Figure 2:
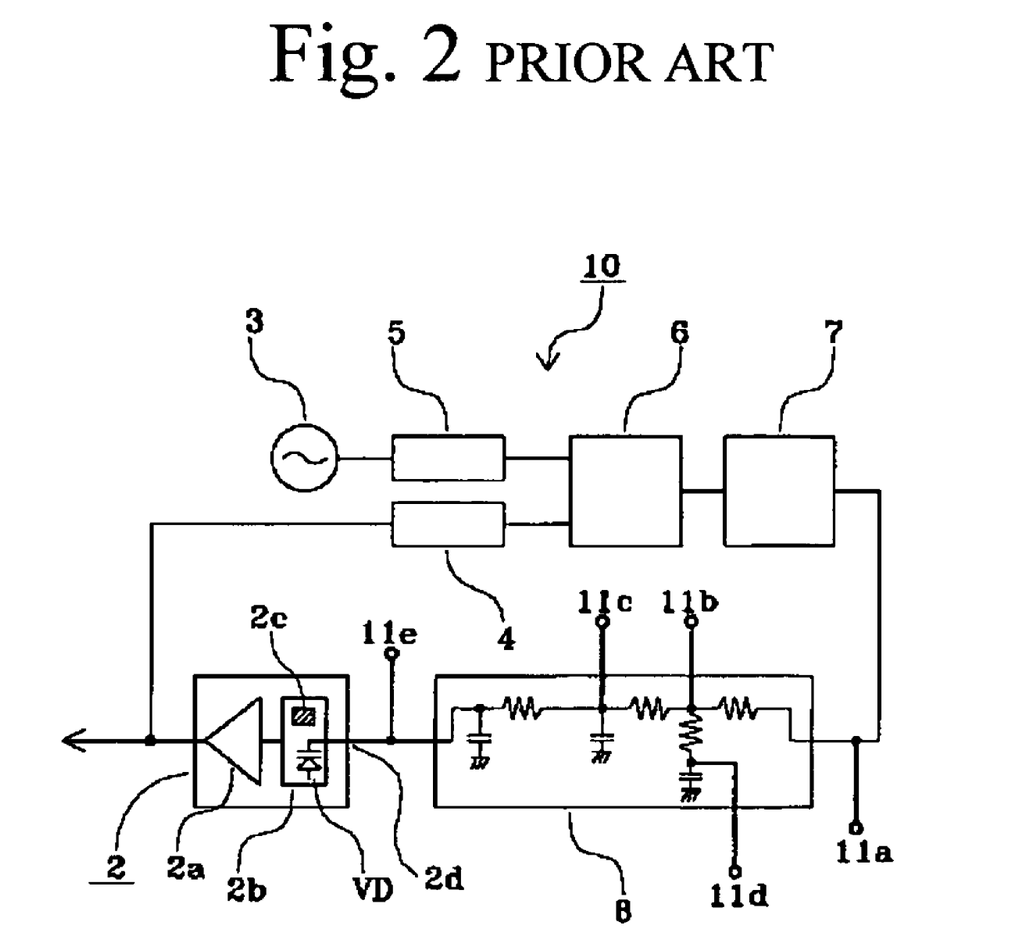
FIG. 2 is a block diagram of a conventional PLL circuit.

FIG. 2 is a circuit diagram of a PLL circuit described in Japanese Patent Application Publication No. 2000-183733. Referring to FIG. 2, a PLL circuit 10 includes a voltage-controlled oscillator 2 equipped with a trimming area 2c serving as an oscillation frequency adjusting mechanism and a control voltage terminal 2d, a charge pump 7, a loop filter 8, an oscillator 3, frequency dividers 4 and 5 and a phase comparator 6. The output of the charge pump 7 is connected to the control voltage terminal 2d via the loop filter 8. Any of voltage applying means 11a through 11e are provided in the route from the output terminal of the charge pump 7 to the control voltage terminal 2d via the loop filter 8. The voltage applying means 11a through 11e apply a predictable dc voltage to the control voltage terminal 2d. Then, the oscillation frequency of the voltage-controlled oscillator 2 is adjusted by using the trimming area 2c. It is therefore possible to rapidly adjust the oscillation frequency of the voltage-controlled oscillator 2 in the PLL circuit 10 without operating the entire PLL circuit 10.

However, this adjustment method is liable to be affected by noise superimposed on the power supply. In order to reduce the influence of this noise and precisely control the VCO at the target frequency, it is necessary to apply a control voltage to a signal line between the charge pump and the voltage-controlled oscillator, particularly at a point close to the side of the charge pump. The position at which the control voltage is applied is thus limited.

SUMMARY OF THE INVENTION

An object of the present invention is to provide a PLL circuit that allows frequency adjustment that is less affected by power noise and is not required to operate the whole PLL circuit and such as a frequency adjustment method and to provide a communication apparatus equipped with such a PLL circuit.

According to an aspect of the present invention, there is provided a PLL circuit including: a voltage-controlled oscillator having a control voltage terminal; a charge pump; a loop filter having an output coupled with the control voltage terminal via the loop filter; and means for connecting any point on a route from an output terminal of the charge pump to the control voltage terminal to ground and disconnecting said point from the ground after a frequency of the voltage-controlled oscillator is adjusted.

According to another aspect of the present invention, there is provided communication apparatus comprising: a mixer mixing a first signal with a second signal; and a PLL synthesizer generating the second signal, the PLL synthesizer comprising: a voltage-controlled oscillator generating the second signal and having a control voltage terminal; a charge pump; a loop filter having an output coupled with the control voltage terminal via the loop filter; and means for connecting any point on a route from an output terminal of the charge pump to the control voltage terminal to ground and disconnecting said point from the ground after a frequency of the voltage-controlled oscillator is adjusted.

According to yet another aspect of the present invention, there is provided a method of adjusting a frequency of a PLL circuit in which an output terminal of a charge pump is coupled with a control voltage terminal of a voltage-controlled oscillator via a loop filter, comprising the steps of; connecting a point on a route from the output terminal of the charge pump to the control voltage terminal to ground; and disconnecting said point from the ground after a frequency of the voltage-controlled oscillator is adjusted.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 3:
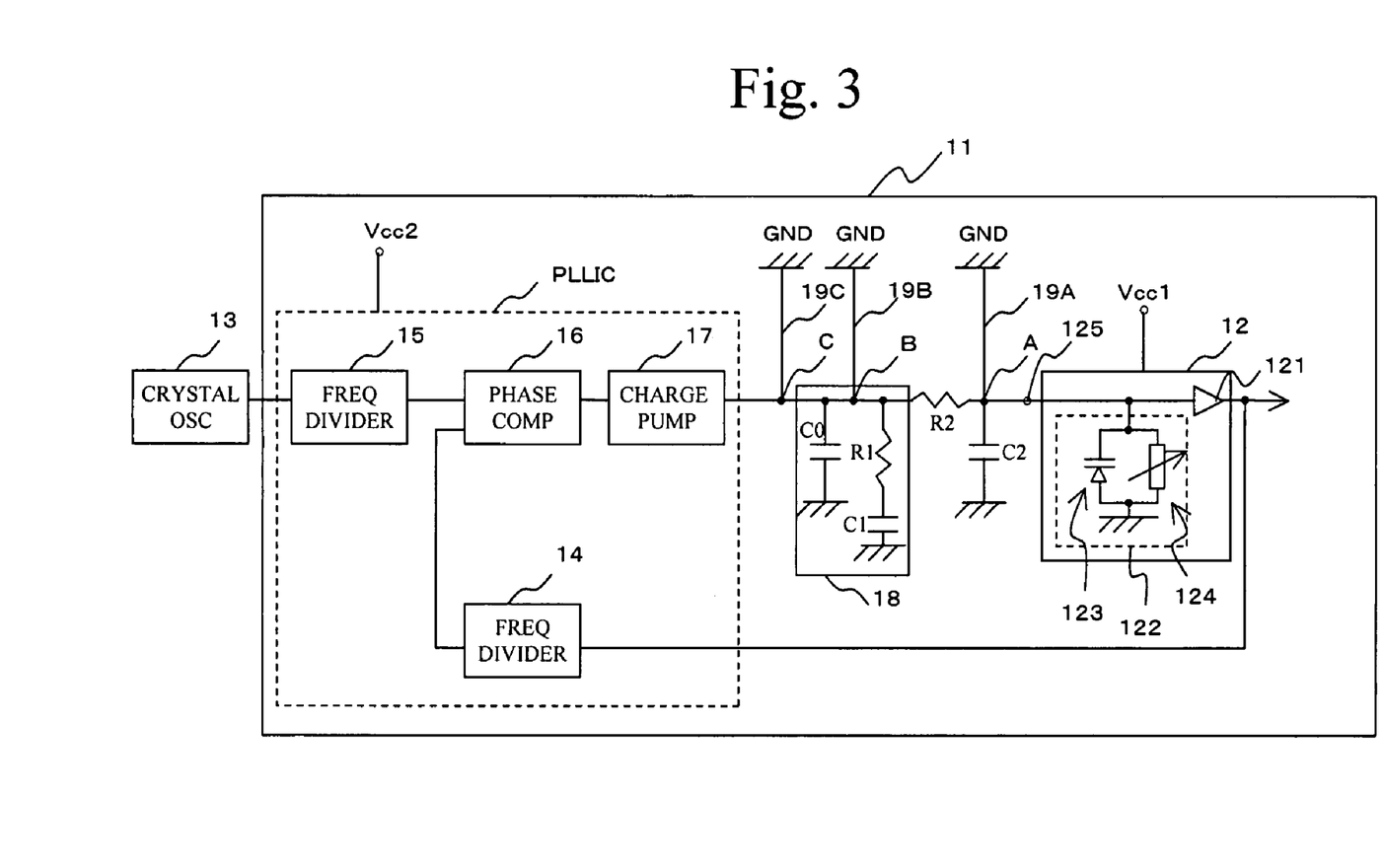
FIG. 3 is a block diagram of a PLL circuit according to an embodiment of the present invention.

FIG. 3 is a block diagram of a PLL circuit according to an embodiment of the present invention. A PLL circuit 11 includes a voltage-controlled oscillator 12, frequency dividers 14 and 15, a phase comparator 16, a charge pump 17, and a loop filter 18. A crystal oscillator 13 is connected to the PLL circuit 11.

The voltage-controlled oscillator 12 is made up of an amplifier circuit 121 and a resonance circuit 122. The resonance circuit 122 includes a variable capacitance diode 123 and an inductance 124 for adjusting the oscillation frequency. The inductance 124 may be formed on a substrate and includes an electrode that forms a part of the resonant system. Trimming of the electrode changes the resonance frequency of the resonance circuit 122, so that the oscillation frequency of the voltage-controlled oscillator 12 can be adjusted.

The voltage-controlled oscillator 12 is equipped with a control voltage terminal 125 via which a dc voltage for changing the oscillation frequency is applied to the variable capacitance diode 123. The output of the resonance circuit 122 is connected to the amplifier circuit 121. The output of the amplifier circuit 121, namely, the output of the voltage-controlled oscillator 12 is connected to the frequency divider 14.

The crystal oscillator 13 is coupled to the phase comparator 16 via the frequency divider 15. The output of the phase comparator 16 is connected to the charge pump 17. The output of the charge pump 17 is connected to the loop filter 18.

The loop filter 18 includes capacitors C0 and C1, and a resistor R1. The capacitor C0 is connected to the output terminal of the charge pump 17 and ground. The resistor R1 and the capacitor C1 are connected in series. The output of the loop filter 18 is connected to the control voltage terminal 125 of the voltage-controlled oscillator 12. The end of the resistor R1 on the side of the charge pump 17 is grounded via a resistor R2 and a capacitor C2. The end of the capacitor C2 to which the resistor R2 is connected is connected to the control voltage terminal 125 of the voltage-controlled oscillator 12.

The voltage-controlled oscillator 12 and a PLL IC are supplied with separate power supply voltages Vcc1 and Vcc2, respectively. The PLL IC used in FIG. 3 is composed of the frequency divider 15, the phase comparator 16, the charge pump 17 and the frequency divider 14. However, the PLL IC is not limited to the configuration shown in FIG. 3.

A description will now be given of means for connecting, to the ground GND, any point on the route from the output terminal of the charge pump 17 to the control voltage terminal 125 and disconnecting that point from the ground GND after the frequency the voltage-controlled oscillator 12 is adjusted. FIG. 3 shows an example in which connecting points A, B and C on the route from the output terminal of the charge pump 17 to the control voltage terminal 125 are connected to the ground GND via connection lines 19A, 19B and 19C, respectively.

The connection lines 19A, 19B and 19C connect the line between the output of the charge pump 17 and the control voltage terminal 125 of the voltage-controlled oscillator 12 to the ground GND. The connection lines 19A, 19B and 19C are cut off after the frequency adjustment of the voltage-controlled oscillator 12. Any of the connecting points A, B and C is connected to the ground by the corresponding one of the connection lines 19A, 19B and 19C. In this state, trimming is performed. Then, the connection line used for trimming is cut off, so that the frequency of the voltage-controlled oscillator 12 can be adjusted without operating the PLL IC.

In FIG. 3, the connection lines 19A, 19B and 19C are connected to the connecting points A, B and C on the line from the output terminal of the charge pump 17 to the control voltage terminal 125. However, the connecting point to be grounded may be arbitrarily selected on the line between the output terminal of the charge pump 17 and the control voltage terminal 125.

The frequency of the voltage-controlled oscillator 12 is adjusted as follows. First, power is supplied to only the voltage-controlled oscillator 12 of the PLL circuit 11. The PLL IC, which is composed of the frequency dividers 14 and 15, the phase comparator 16 and the charge pump 17, is not operated. The control voltage terminal 125 of the voltage-controlled oscillator 12 is connected to the ground GND via any of the connection lines 19A, 19B and 19C.

Next, the oscillation frequency of the voltage-controlled oscillator 12 is adjusted by trimming the inductance 124. In this manner, the oscillation frequency in the PLL circuit 11 can be adjusted by the simple procedure. In the adjustment work, the PLL IC including the frequency dividers 14 and 15, the phase comparator 16 and the charge pump 17 does not operate. Thus, any equipment for controlling the PLL IC such as a computer is not needed to carry out the frequency adjustment. Further, the frequency adjustment does not need to establish the phase-locked state, so that it takes only a short time to obtain the target oscillation frequency.

Figure 4:
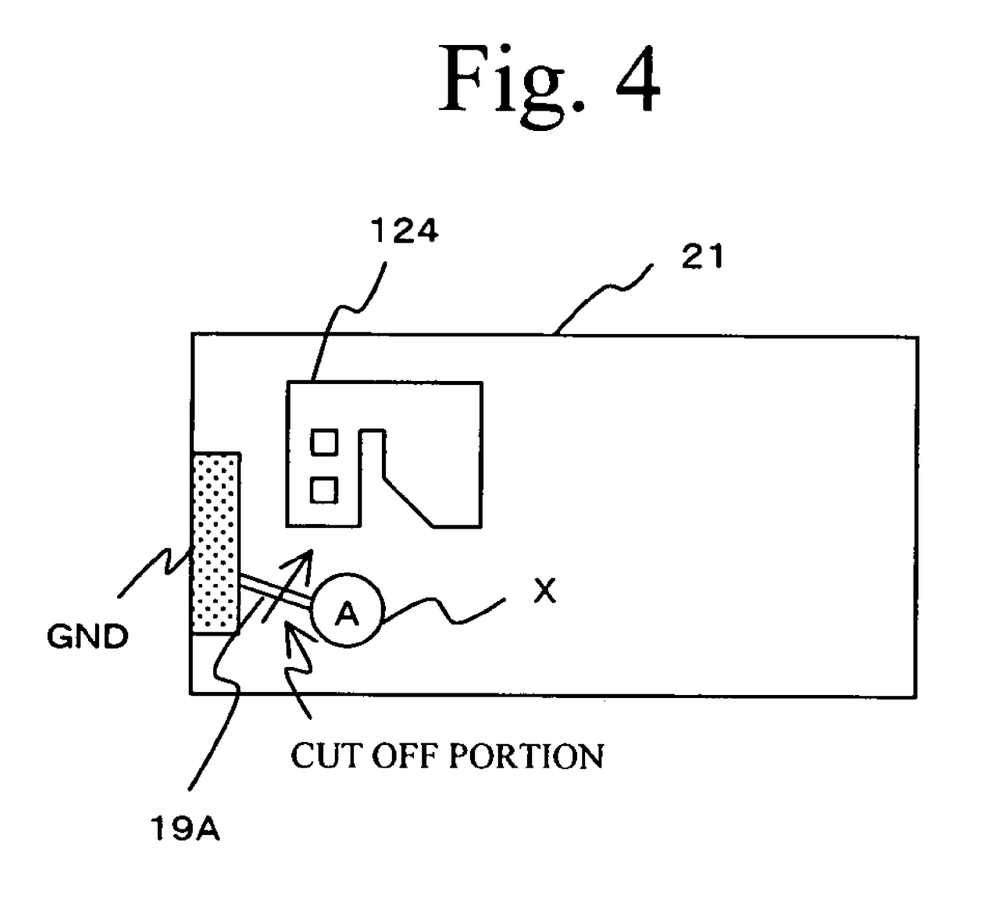
FIG. 4 is a view of a part of the PLL circuit according to the present embodiment.

FIG. 4 shows a part of the PLL circuit 11, and more particularly shows a plan view of a part of the PLL circuit formed on a substrate, which may be packaged. Referring to FIG. 4, the PLL circuit 11 has a packaged substrate 21 on which the inductance 124 for adjusting the frequency of the voltage-controlled oscillator 12 and any of the connecting points on the route from the output terminal of the charge pump 17 to the control voltage terminal 125 are exposed. In the example shown in FIG. 4, the connecting point A is exposed on the substrate 21.

The connection line 19A connects the connecting point A and the ground GND. The connection line 19 is a wiring electrode, which is cut off as indicated by the arrow shown in FIG. 4 after the frequency adjustment of the voltage-controlled oscillator 12.

The inductance 124 to be trimmed and the wiring electrode of the connection line 19A to be finally cut off are provided on the same surface of the substrate 21. Thus, the frequency adjusting work can be carried out on the same surface. The frequency adjustment work includes the steps of connecting the route from the output terminal of the charge pump 17 to the control voltage terminal 125 to the ground GND, adjusting the voltage-controlled oscillator 12, and disconnecting the connecting point A from the ground GND. Thus, the workability can be improved.

Figure 5:
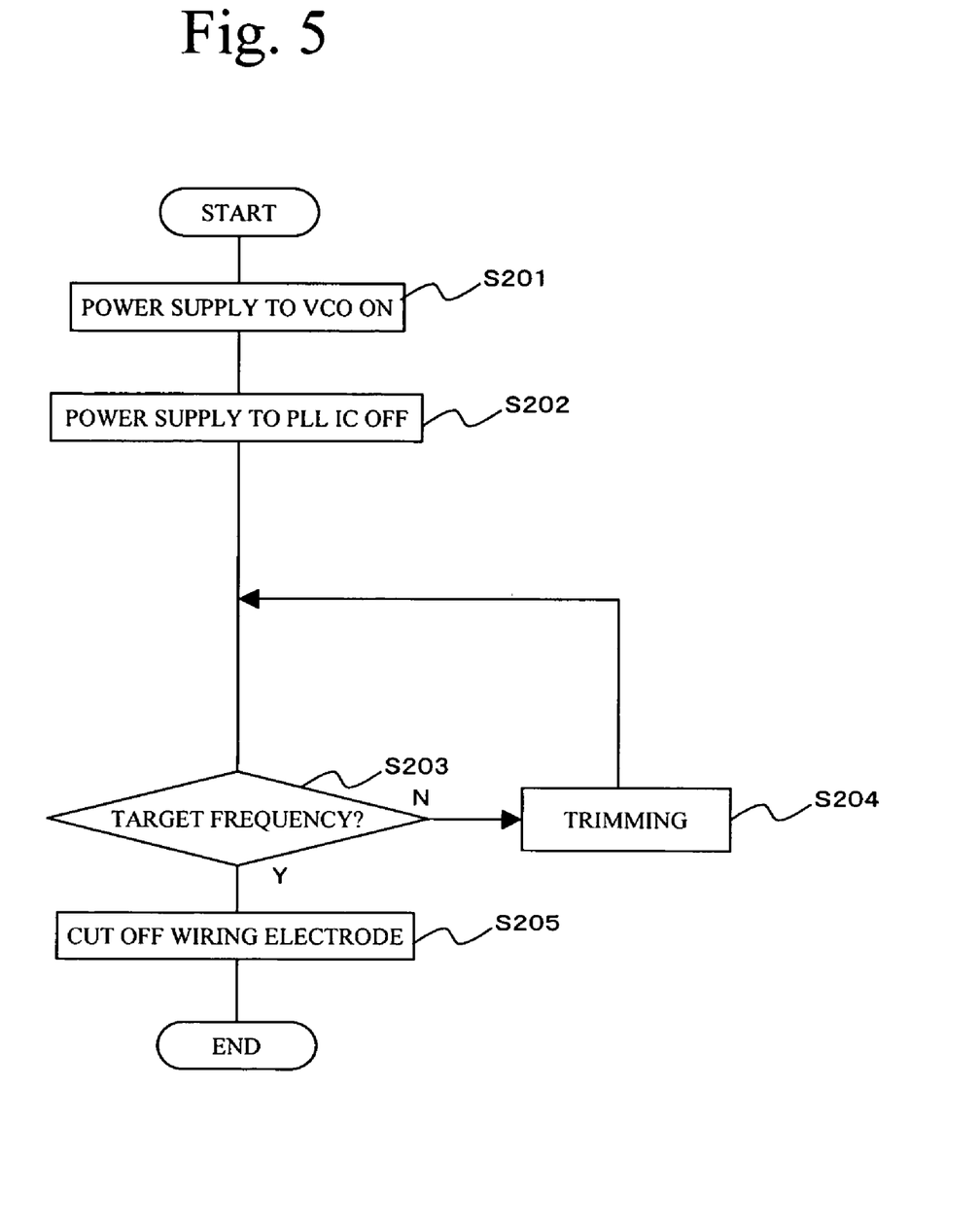
FIG. 5 is a flowchart of a process for adjusting the oscillation frequency of a voltage-controlled oscillator according to the present embodiment.

FIG. 5 shows a method of adjusting the oscillation frequency of the voltage-controlled oscillator 12. At step 201, the operating voltage is applied to the voltage-controlled oscillator 12. At this time, the connecting point A is grounded. The prior art supplies power to the PLL IC, whereas the present embodiment does not supply the PLL IC with power (step 202).

At step 203, it is determined whether the oscillation frequency of the voltage-controlled oscillator 12 is equal to the target frequency. If the answer of step 203 is NO, the pattern that forms the inductance 124 in the resonance circuit 122 of the voltage-controlled oscillator 12 is trimmed so as to obtain the target frequency at step 204. It is to be noted that no power is supplied to the PLL IC during trimming and the PLL IC is not operating.

If the answer of step 203 is YES, that is, if the voltage-controlled oscillator 12 is now oscillating at the target frequency, the process proceeds to step 205, at which the connection line 19 that connects the connecting point A to the ground GND is cut off. In this manner, the trimming is finished and a next step of testing is carried out.

According to the above-mentioned frequency adjusting method, the frequency of the voltage-controlled oscillator can be adjusted without being affected by noise on the power supply and without operating the entire PLL circuit. The loop setting of the PLL IC is not needed to adjust the oscillation frequency, so that the time necessary for the frequency adjustment of the voltage-controlled oscillator can be shortened. Further, the present frequency adjustment does not need specific instruments such as a personal computer or controller, the operating power and control voltage required to perform the loop setting of the PLL IC. Furthermore, the frequency adjustment does not need any specific dc power supply, which is supplied via the probe from power supply means in the prior art.

A description will now be given of another means for connecting any connecting point on the route from the output terminal of the charge pump 17 to the control voltage terminal 125 to the ground GND and disconnecting the connecting point from the ground GND after the frequency of the voltage-controlled oscillator 12 is adjusted. This means uses the wiring electrode of the connection line in FIG. 4. The means that will be described below employs a jumper chip. That is, a jumper chip is used instead of the wiring electrode to connect, to the ground GND, any connecting point on the route from the output terminal of the charge pump 17 to the control voltage terminal 125 when the frequency of the voltage-controlled oscillator 12 is adjusted. After the frequency is adjusted, the jumper chip is removed so that the connecting point is detached from the ground GND. In this manner, the frequency of the voltage-controlled oscillator can be adjusted without operating the entire the PLL circuit.

The jumper chip may be placed on a pattern provided to mount the capacitor C0 in the loop filter 18 shown in FIG. 3. This way does not require a specific pattern for mounting the jumper chip. The capacitor C0 may be mounted on the pattern after trimming of the inductance 124.

Figure 6:
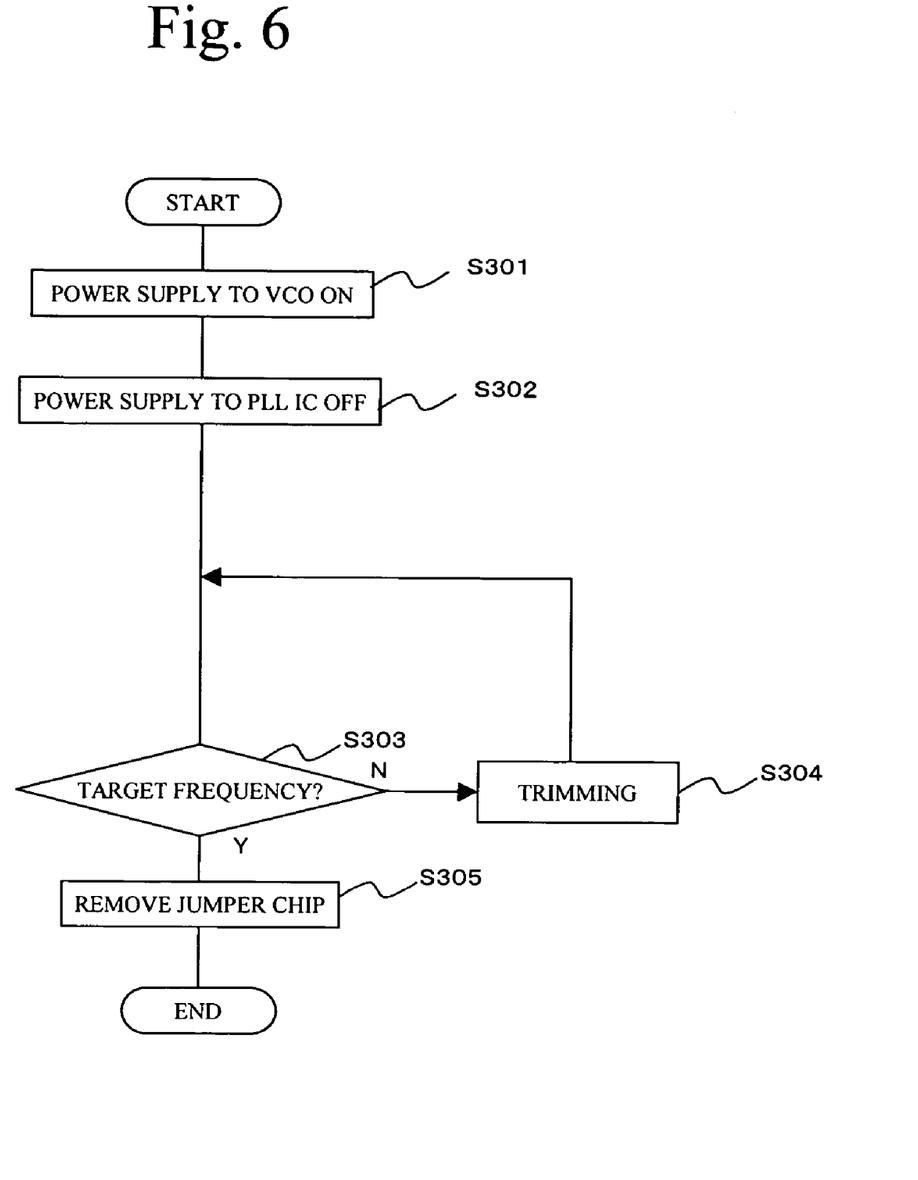
FIG. 6 is a flowchart of a process for adjusting the oscillation frequency of the voltage-controlled oscillator according to another embodiment of the invention.

FIG. 6 shows a method of adjusting the oscillation frequency of the voltage-controlled oscillator 12 in the PLL circuit 11 by using the jumper chip. At step 301, power is supplied to the voltage-controlled oscillator 12 via the power supply line connected thereto, so that the oscillator 12 can be operated. At this time, the connecting point A is connected to the ground GND using the jumper chip. No power is supplied to the PLL IC (step 302), whereas the conventional art supplies power to the PLL IC.

At step 303, it is determined whether the oscillation frequency is equal to the target frequency. If the answer is NO, that is, if the voltage-controlled oscillator does not operate at the target frequency, the inductance 124 is trimmed at step 304. Then, step 303 is performed. The steps 303 and 304 are repeatedly carried out until the answer of step 303 becomes YES. In the loop of the steps 303 and 304, no power is supplied to the PLL IC, which does not operate.

When the answer of step 303 becomes YES, the process proceeds to step 305, at which the jumper chip that grounds the connecting point A is removed. Then, the process proceeds to a next step of testing. According to the above-mentioned frequency adjusting method, the frequency of the voltage-controlled oscillator can be adjusted without being affected by noise on the power supply and without operating the entire PLL circuit.

No loop setting of the PLL IC is needed to adjust the oscillation frequency, so that the time necessary for the frequency adjustment of the voltage-controlled oscillator can be shortened. Further, the present frequency adjustment does not need specific instruments such as a personal computer or controller, the operating power and control voltage required to perform the loop setting of the PLL IC. Furthermore, the frequency adjustment does not need any specific dc power supply, which is supplied via the probe from power supply means in the prior art.

A description will now be given of yet another means for connecting any connecting point on the route from the output terminal of the charge pump 17 to the control voltage terminal 125 to the ground GND and disconnecting the connecting point from the ground GND after the frequency of the voltage-controlled oscillator 12 is adjusted. In the foregoing, the means is the wiring electrode or jumper chip. The means described below uses a jumper wire or jumper pin, which is used instead of the wiring electrode or jumper chip to connect, to the ground GND, any connecting point on the route from the end of the charge pump 17 to the control voltage terminal 125 when the frequency of the voltage-controlled oscillator 12 is adjusted. After the frequency is adjusted, the jumper wire or pin is removed so that the connecting point is detached from the ground GND. In this manner, the frequency of the voltage-controlled oscillator can be adjusted without operating the entire the PLL circuit.

Specific pads or connectors may be provided to use the jumper wire or pin for grounding. The method of adjusting the oscillation frequency with the jumper wire or pin is the same as that with the jumper chip, and a description thereof will be omitted here.

A description will now be given of further means for connecting any connecting point on the route from the output terminal of the charge pump 17 to the control voltage terminal 125 to the ground GND and disconnecting the connecting point from the ground GND after the frequency of the voltage-controlled oscillator 12 is adjusted. Solder provided at solder printing is used instead of the wiring electrode, jumper chip, jumper wire and jumper pin.

Solder is provided at solder printing instead of the aforementioned wire electrode at any point on the route from the output terminal of the charge pump 17 to the control voltage terminal 125. A pad may be provided to receive solder bumps. In a step of reflow, the solder is melted so as to make the connection between the connecting point and ground GND. After the frequency adjustment of the voltage-controlled oscillator 12, the solder that bridges the pads is removed, so that the connecting point can be disconnected from the ground GND. In this manner, the frequency can be adjusted without operating the entire PLL circuit.

Figure 7:
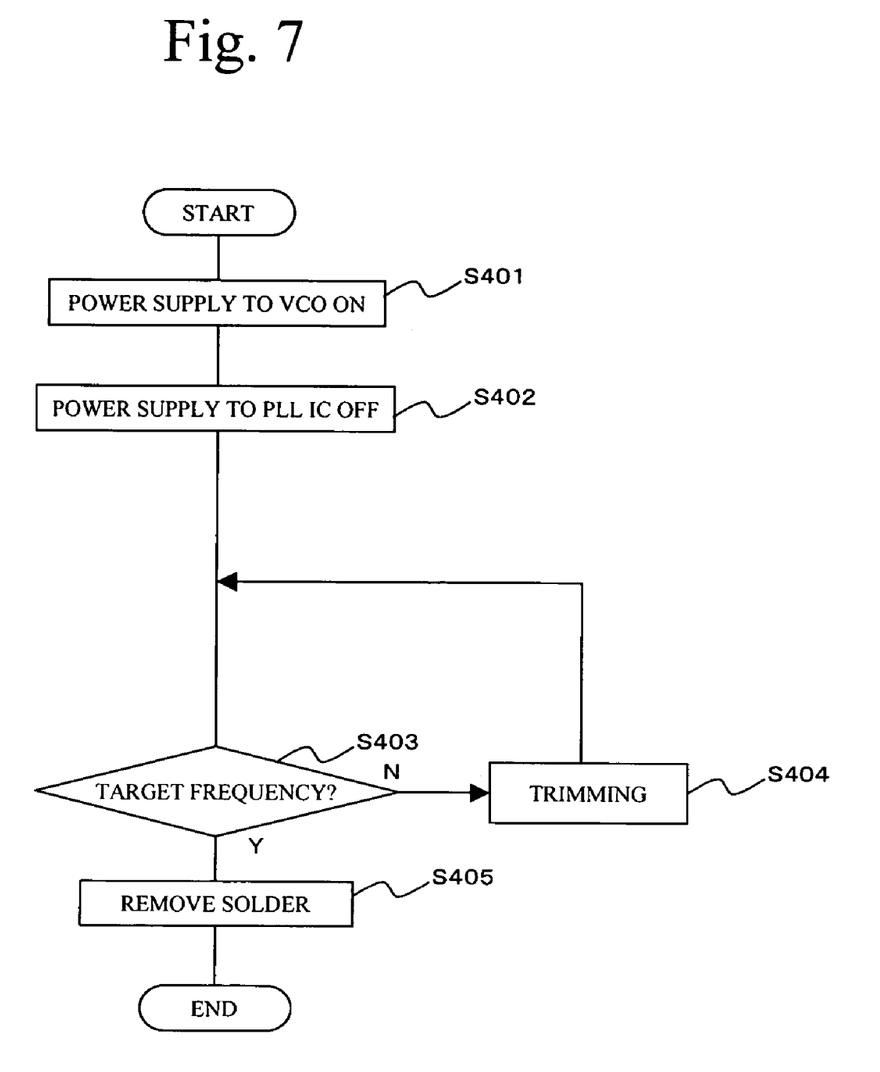
FIG. 7 is a flowchart of a process for adjusting the oscillator frequency of the voltage-controlled oscillator according to yet another embodiment of the present invention.

FIG. 7 shows a method of adjusting the oscillation frequency of the voltage-controlled oscillator 12 in the PLL circuit 11 by using solder. At step 401, power is supplied to the voltage-controlled oscillator 12 via the power supply line connected thereto, so that the oscillator 12 can be operated. At this time, the connecting point A is connected to the ground GND using the solder. No power is supplied to the PLL IC (step 402), whereas the conventional art supplies power to the PLL IC.

At step 403, it is determined whether the oscillation frequency is equal to the target frequency. If the answer is NO, that is, if the voltage-controlled oscillator does not operate at the target frequency, the inductance 124 is trimmed at step 404. Then, step 403 is performed. The steps 403 and 404 are repeatedly carried out until the answer of step 403 becomes YES. In this loop of judgment, no power is supplied to the PLL IC, which does not operate.

When the answer of step 403 becomes YES, the process proceeds to step 405, at which the solder that grounds the connecting point A is removed. Then, the process proceeds to a next step of testing. According to the above-mentioned frequency adjusting method, the frequency of the voltage-controlled oscillator can be adjusted without being affected by noise on the power supply and without operating the entire PLL circuit.

The loop setting of the PLL IC is not needed to adjust the oscillation frequency, so that the time necessary for the frequency adjustment of the voltage-controlled oscillator can be shortened. Further, the present frequency adjustment does not need specific instruments such as a personal computer or controller, the operating power and control voltage required to perform the loop setting of the PLL IC. Furthermore, the frequency adjustment does not need any specific dc power supply, which is supplied via the probe from power supply means in the prior art.

Any element other than the wiring electrode, jumper chip, jumper wire, jumper pin and solder may be used as means for connecting, to the ground GND, any connecting point on the route from the output terminal of the charge pump 17 to the control voltage terminal 125 and disconnecting the connecting point from the ground GND.

Figure 8:
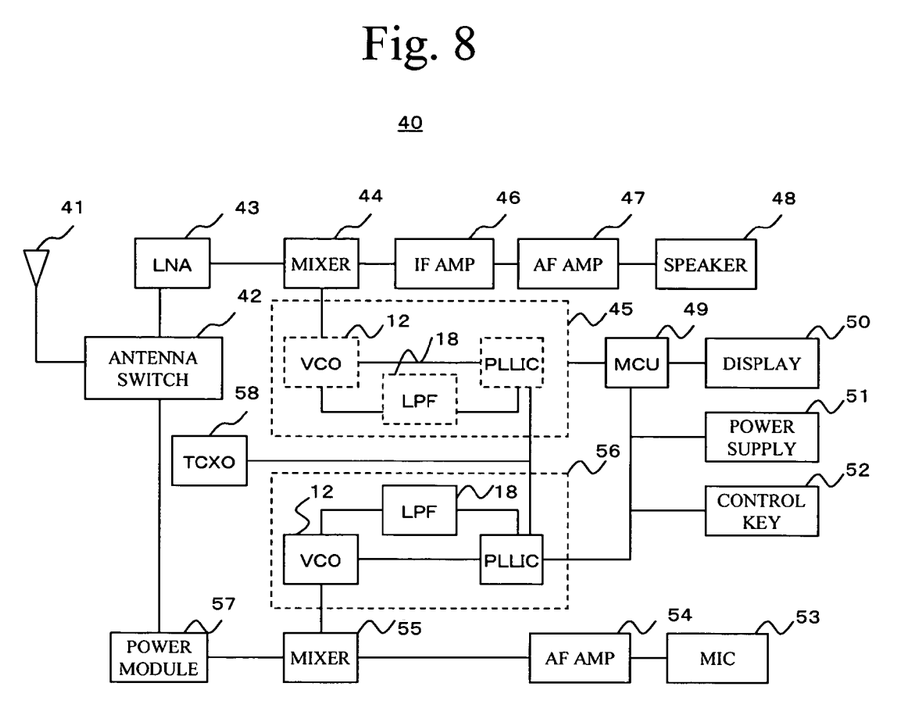
FIG. 8 is a block diagram of a communication apparatus according to an embodiment of the present invention.

A description will now be given of a communication apparatus equipped with any of the above-mentioned PLL circuits. FIG. 8 is a block diagram of a communication apparatus 40 equipped with the PLL circuit 11 shown in FIG. 3. The communication apparatus 40 includes an antenna 41, an antenna switch (duplexer) 42, a low-noise amplifier (LNA) 43, a mixer 44, a PLL synthesizer 45, an IF amplifier 46, an AF (Audio Frequency) amplifier 47, a speaker 48, a microcontroller unit (MCU) 49, a display 50, a power supply 51, a control key 52, a microphone 53, an AF amplifier 54, a mixer 55, a PLL synthesizer 56, a power module 57, and a crystal oscillator (TCXO) 58 with a temperature compensation circuit.

Each of the PLL synthesizers 45 and 56 provided for transmit and receive systems includes the aforementioned VCO 12, PLL IC and the loop (low-pass) filter 18. The antenna 41 is coupled with the mixer 44 via the antenna switch 42 and the LNA 43. The PLL synthesizer 45 is connected to the mixer 44. The output of the mixer 44 is coupled with the speaker 48 via the IF amplifier 46 and the AF amplifier 47.

The LNA 43 processes an RF signal received by the antenna 41 so that unnecessary signals are removed from the RF signal, and is applied to the mixer 44. A local signal generated by the PLL synthesizer 45 is applied to the mixer 44. The mixer 44 mixes the two input signals and produces a resultant frequency signal IF of the frequency equal to the difference between these input signals. The IF signal from the mixer 44 is input to the speaker 48 via the IF amplifier 46 and AF amplifier 47.

The microphone 53 is connected to the mixer 55 via the AF amplifier 54. The PLL synthesizer 56 is connected to the mixer 55. The output of the mixer 55 is coupled with the antenna 41 via the power module 57 and the antenna switch 42. The signal of the microphone 53 is amplified by the AF amplifier 54 and is input to the mixer 55.

A local signal generated by the PLL synthesizer 56 is input to the mixer 55. The mixer 55 mixes the two input signals and produces a resultant frequency signal of the frequency equal to the difference between these input signals. The output signal of the mixer 55 is sent to the outside of the communication apparatus 40 via the power module 57 and the antenna switch 42. The communication apparatus uses the precise frequencies generated by the PLL synthesizers 45 and 56 equipped with the PLL circuits, so that the mixers 44 and 55 can produce the precise frequency signals.

The present invention is not limited to the specifically disclosed embodiments, and other embodiments, variations and modifications may be made without departing from the scope of the present invention.

What is claimed is:

1. A PLL circuit comprising:
   a voltage-controlled oscillator having a control voltage terminal and an adjusting means for adjusting a frequency of the voltage-controlled oscillator;
   a charge pump;
   a loop filter having an output coupled with the control voltage terminal via the loop filter; and
   a shorting member that initially connects ground to a conductor connecting an output terminal of the charge pump to the control voltage terminal and permanently disconnects the conductor from the ground after the frequency of the voltage-controlled oscillator is adjusted.

2. The PLL circuit as claimed in claim 1, wherein the voltage-controlled oscillator comprises a resonance circuit having an inductance formed on a substrate and a variable-capacitance diode connected in parallel with the inductance.

3. The PLL circuit as claimed in claim 2, wherein the inductance and said means are provided on an identical surface of the substrate.

4. A PLL circuit comprising:
   a voltage-controlled oscillator having a control voltage terminal and an adjusting means for adjusting a frequency of the voltage-controlled oscillator;
   a charge pump;
   a loop filter having an output coupled with the control voltage terminal via the loop filter; and
   shorting means for connecting ground to a conductor connecting an output terminal of the charge pump to the control voltage terminal and disconnecting said conductor from the ground after the frequency of the voltage-controlled oscilator is adjusted,
   wherein said means comprises a wiring electrode that is cut after the frequency of the voltage-controlled oscillator is adjusted.

5. A PLL circuit comprising:
   a voltage-controlled oscillator having a control voltage terminal and an adjusting means for adjusting a frequency of the voltage-controlled oscillator;
   a charge pump;
   a loop filter having an output coupled with the control voltage terminal via the loop filter; and
   shorting means for connecting ground to a conductor connecting an output terminal of the charge pump to the control voltage terminal and disconnecting said conductor from the ground after the frequency of the voltage-controlled oscillator is adjusted,
   wherein said means comprises a jumper chip.

6. The PLL circuit as claimed in claim 5, wherein the loop filter has a pattern on which a capacitor between the output terminal of the charge pump and ground is mounted, and the jumper chip is mounted on the pattern.

7. A PLL circuit comprising:
a voltage-controlled oscillator having a control voltage terminal and an adjusting means for adjusting a frequency of the voltage-controlled oscillator;
a charge pump;
a loop filter having an output coupled with the control voltage terminal via the loop filter; and
shorting means for connecting ground to a conductor connecting an output terminal of the charge pump to the control voltage terminal and disconnecting said conductor from the ground after the frequency of the voltage-controlled oscillator is adjusted,
wherein said means comprises one of a jumper wire and a jumper pin.

8. A PLL circuit comprising:
a voltage-controlled oscillator having a control voltage terminal and an adjusting means for adjusting a frequency of the voltage-controlled oscillator;
a charge pump;
a loop filter having an output coupled with the control voltage terminal via the loop filter; and
shorting means for connecting ground to a conductor connecting an output terminal of the charge pump to the control voltage terminal and disconnecting said conductor from the ground after the frequency of the voltage-controlled oscillator is adjusted,
wherein said means comprises solder.

9. A PLL circuit comprising:
a voltage-controlled oscillator having a control voltage terminal and an adjusting means for adjusting a frequency of the voltage-controlled oscillator;
a charge pump;
a loop filter having an output coupled with the control voltage terminal via the loop filter;
shorting means for connecting ground to a conductor connecting an output terminal of the charge pump to the control voltage terminal and disconnecting said conductor from the ground after the frequency of the voltage-controlled oscillator is adjusted, and
a phase comparator and a frequency divider,
wherein a power supply line provided for the circuit composed of the charge pump, the phase comparator and the frequency divider is separate from a power supply line provided for the voltage-controlled oscillator.

10. A communication apparatus comprising:
a mixer mixing a first signal with a second signal; and
a PLL synthesizer generating the second signal,
the PLY synthesizer comprising:
a voltage-controlled oscillator generating the second signal and having control voltage terminal and an adjusting means for adjusting a frequency of the voltage-controlled oscillator;
a charge pump;
a loop filter having an output coupled with the control voltage terminal via the loop filter; and
a shorting member that initially connects ground to a conductor connecting an output terminal of the charge pump to the control voltage terminal and permanently disconnects said conductor from the ground after the frequency of the voltage-controlled oscillator is adjusted.

11. A method of adjusting a frequency of a PLL circuit in which an output terminal of a charge pump is coupled with a control voltage terminal of a voltage-controlled oscillator via a loop filter, comprising the steps of;
connecting ground to a conductor connecting the output terminal of the charge pump to the control voltage terminal with a shorting member; and
disconnecting said conductor from the ground, after a frequency of the voltage-controlled oscillator is adjusted, by cutting the member.

* * * * *